United States Patent [19]

Bühlmann et al.

[11] Patent Number: 5,374,449
[45] Date of Patent: Dec. 20, 1994

[54] MONOLITHIC PIEZOELECTRIC STRUCTURAL ELEMENT FOR KEYBOARDS AND METHOD OF MANUFACTURING

[75] Inventors: Albert Bühlmann, Staufen; Hans Schenk, Beinwil, both of Switzerland

[73] Assignee: Algra Holding AG, Cham, Switzerland

[21] Appl. No.: 80,620

[22] Filed: Jun. 22, 1993

[30] Foreign Application Priority Data

Jun. 24, 1992 [CH]  Switzerland ............... 01983/92

[51] Int. Cl.⁵ ............................................. B05D 1/00
[52] U.S. Cl. ................................ 427/100; 427/126.1; 427/126.2; 427/331; 427/376.1; 427/385.5; 427/404; 427/405; 101/129
[58] Field of Search ............. 427/100, 404, 405, 126.2, 427/126.1, 331, 376.1, 385.5; 101/129

[56] References Cited

U.S. PATENT DOCUMENTS

| | | | |
|---|---|---|---|
| 3,940,637 | 2/1976 | Ohigashi | 310/8.5 |
| 4,056,654 | 11/1977 | Kompanek | 428/409 |
| 4,158,117 | 6/1979 | Quilliam et al. | 200/181 |
| 4,190,785 | 2/1980 | Kompanek | 310/330 |
| 4,628,573 | 12/1986 | Hamada et al. | 29/25.35 |
| 4,649,310 | 3/1987 | Nakamura et al. | 310/321 |
| 4,651,042 | 3/1987 | Nakamura et al. | 310/321 |
| 4,670,074 | 6/1987 | Broussoux et al. | 156/198 |
| 4,717,851 | 1/1988 | Fenner et al. | 310/334 |
| 4,764,244 | 8/1988 | Chitty et al. | 156/630 |
| 4,826,616 | 5/1989 | Tanino et al. | 252/62.9 |
| 5,047,162 | 9/1991 | Krug et al. | 252/62.9 |
| 5,072,035 | 12/1991 | Chen et al. | 252/62.9 |
| 5,153,859 | 10/1992 | Chatigny et al. | 367/140 |

FOREIGN PATENT DOCUMENTS

| | | |
|---|---|---|
| 0203261 | 9/1988 | European Pat. Off. . |
| 0408306A3 | 1/1991 | European Pat. Off. . |
| 0472888A1 | 3/1992 | European Pat. Off. . |
| 2161647A | 1/1986 | United Kingdom . |

Primary Examiner—Michael Lusignan
Assistant Examiner—Vi Duong Dang
Attorney, Agent, or Firm—Barnes & Thornburg

[57] ABSTRACT

A monolithic piezoelectric key structure having a piezoelectric layer adherently connected between two conductive areas. The piezoelectric layer is applied as a fluid on the base conductive area and transformed into a coherent solid adhering to the base conductive area. The other conductive area is adherently formed on the piezoelectric layer. The monolithic structure is polarized.

10 Claims, 3 Drawing Sheets

MONOLITHIC PIEZOELECTRIC STRUCTURAL ELEMENT FOR KEYBOARDS AND METHOD OF MANUFACTURING

This invention relates to a method of manufacturing piezoelectric elements known as pressure-sensitive keys or keyboards, and to the elements obtained.

In most applications, a piezoelectric material is used which is provided with electrodes on both sides and into which the corresponding structural element is installed. Examples of piezoelectric keys of this type are described in the European Patent 0 472 888 and Swiss Patent 600 581. However, the manufacturing of such structural parts is difficult because they consist of several components and require expensive processing for mounting them in the structural element. Thus, a keyboard according to the European Patent 0 472 888 corresponding to U.S. Ser. No. 07/751,987 consists of at least two films, which carry strip conductors and contact surfaces, as well as one piezoceramic lamina for each key. For the assembling of a keyboard, the foils and the piezoceramic lamina must be positioned relative to one another and must be glued together. The mounting of the piezoceramic lamina results in high expenditures and represents a limit with respect to the efficiency and costs of the production of such keyboards.

It is therefore an object of the invention to provide a piezoelectric element of such structure that manual interventions can be substantially omitted in the course of production thereof. A more specific object of the invention is a piezoelectric structure that includes at least one piezoelectric layer which can be put into it's operative position in an improved manner and without laborious assembly and mounting of individual prefabricated piezoelectric elements. Another object is to provide a piezolelectric element in which all topically defined elements including electrically conductive layers and/or pathes, piezoelectric layer areas as well as topically defined insulating and distancing areas can be applied onto a base, carrier or substrate in a sequence of methodically uniform and essentially similar process steps, such as by means of the so-called "thick-film" or "thin-film" application technology, and in the form of structured coatings of substantially any desired shape and configuration. Another object is a piezoelectric element which can be produced in a more economical manner without sacrificing operational properties or even with improved properties. Yet a further object is to provide a method for manufacturing piezoelectric structures of any desired complexity, such as fairly large keyboards, economically and in large series.

These and other objects are obtained by a method of manufacture wherein a base layer having at least one first electrically conductive area is provided. A thin layer of fluid piezoelectric precursor material is applied onto the first electrically conductive area and transformed into an essentially coherent uniform solid film of a composite piezoelectric material firmly adhered to the first electrically conductive area. A second electrically conductive area is formed spaced from the first electrically conductive area firmly adhering to the piezoelectric material. This provides an essentially monolithic piezoelectric element at a key location which firmly adheres to the base layer and includes the composite piezoelectric material and the first and second electrically conductive areas. The composite piezoelectric material is polarized. A cover layer is provided. A spacer or distancing device in the area adjacent to the monolithic element is also formed. The various layers, namely the electrically conductive areas, the piezoelectric layer and, optionally, the spacer are formed by fluid deposition techniques and preferably by screen printing.

Depending upon the material being used and the desired thickness of the piezoelectric material and the other applied layers, multiple application and transforming or setting steps may be performed. To further increase the thickness of the total key structure, first electrically conductive areas may be provided on both sides of the base layer and have a pair of sandwich structures formed thereon. Also a bimorphic piezoelectric sandwich element maybe formed. The process is modified by forming a second composite piezoelectric material on the second electrode and forming an additional electrode on the second piezoelectric material.

An additional advantage of the invention is the fact that the applied process technology permits that, in addition to conducting, insulating and piezoelectric layer structures, additional elements can be integrated, such as resistors, capacitors or diodes. Further, continuous sequences of piezoelectric may be obtained in the form of a continuous web or band.

Other advantages and applications are found in the following description of some embodiments of the structural part by means of the figures.

Figures 1, 2:
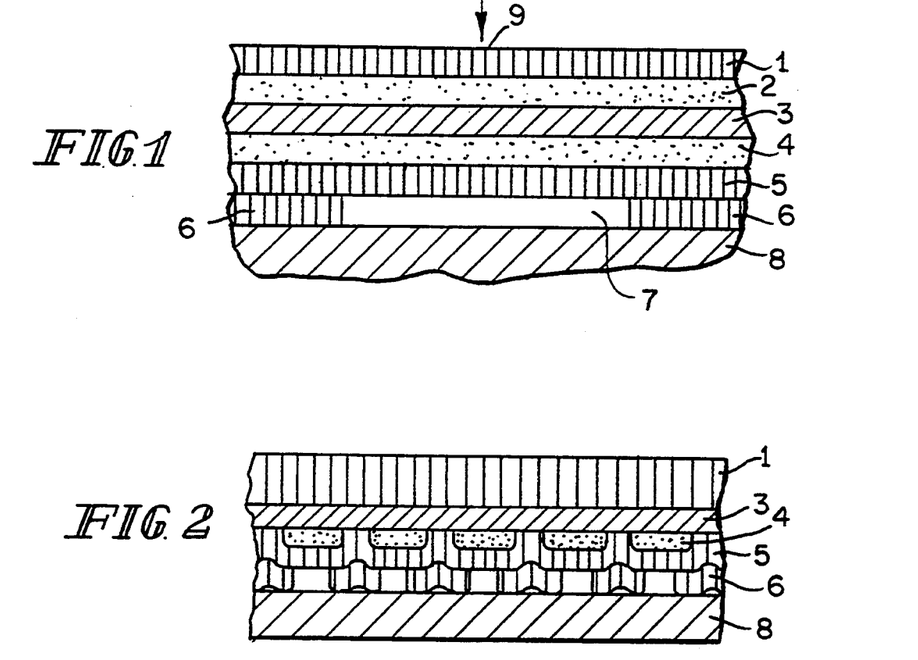
FIG. 1 is a schematic view of the construction of an individual piezoelectric key according to the invention.
FIG. 2 is a view of a construction with several keys which are printed directly onto the back of a front plate.

FIG. 1 illustrates a construction of an individual piezoelectric key of a keyboard. It has a carrier or base layer 1, a first conductor layer 2, a piezoelectric layer 3, a second conductor layer 4, an insulating or protective layer 5 and a bonding or distancing layer 6 which connects the key with a support foil or support plate 8. In the bonding layer 6, a hollow space 7 is recessed underneath a pressure point 9 which fixes the key.

A force applied to the pressure point 9 in the direction of the drawn arrow, in the case of this arrangement, results in a bending of the piezoelectric layer 3 which, by way of the piezoelectric effect, leads to the generating of an electric voltage between the conductor layers 2 and 4. The conductor layers 2 and 4 are connected with an electronic circuit which permits the detecting of this voltage and emits a keyboard actuating signal.

In this example, the manufacturing of the key takes place by several screen printing steps in which the layers 2 to 6 are printed onto the carrier layer 1 as coatings or are glued on as foils. The piezoelectric layer 3 and conductor layers 2 and 4 firmly adhere to each other to form an essential monolithic piezoelectric sandwich element firmly adhering to the carrier layer 1.

In this case, typical layer thicknesses are in the order of from 1 to 100 µm.

It should be noted that the construction according to FIG. 1 may be varied. Thus, a thin metal lamina may, for example, be used as the carrier layer 1, onto which the structures are printed, as indicated in FIG. 2. The metal lamina 1 may in this case be used directly as the front plate of a keyboard. According to the application, it is useful in this case to use the metal lamina 1 directly as the common electrode, whereby, as indicated in FIG. 2, the conducting layer 2 is omitted. Also an additional insulating layer may be inserted between the metal lamina and the conducting layer 2.

In the case of another embodiment, the bonding layer 6 and the support plate 8 may be omitted. A bending of the piezoelectric layer will then be caused by the concentration of the actuation force on one point of the key surface. This may be accomplished, for example, by a suitable development of the back side of the front plate 1.

In the case of another embodiment, the insulating layer 5 may, for example, be omitted, particularly when the support plate 8 is not electrically conducting or is at the same electric potential as the conductor layer 4.

Figure 3:
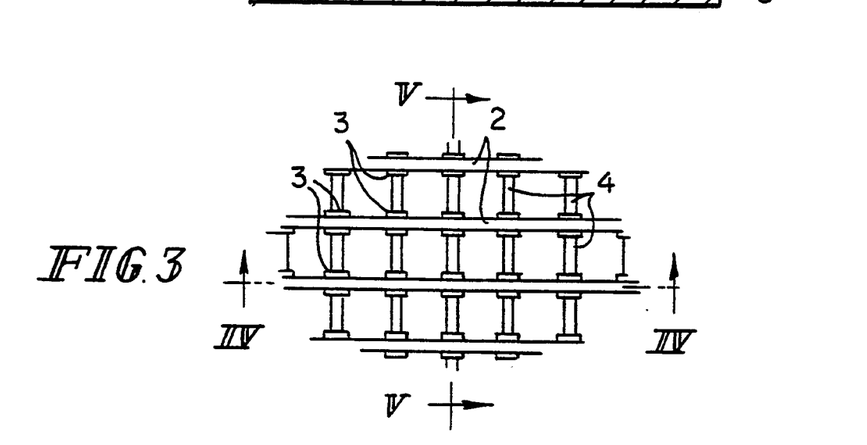
FIG. 3 is a top view of an embodiment of a keyboard matrix.
Figure 4:
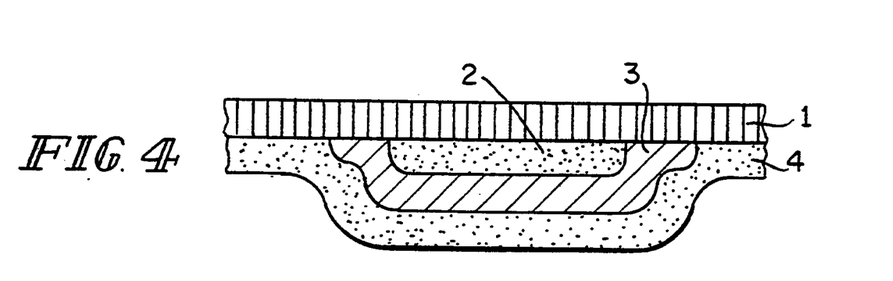
FIG. 4 is a lateral view of the keyboard matrix along Line IV—IV of FIG. 3.
Figure 5:
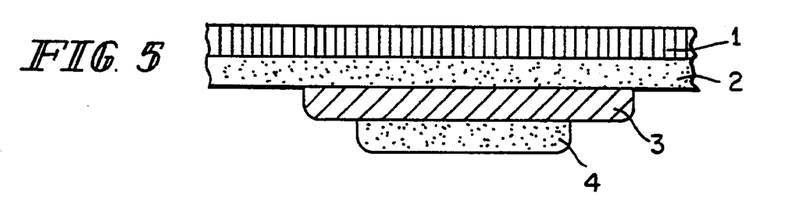
FIG. 5 is a lateral view of the keyboard matrix along Line V—V of FIG. 3.

The fact that the layers to be applied can be patterned makes it possible to also apply much more complicated structures with a plurality of separate piezoelements on a single carrier layer. FIGS. 3 to 5 show, for example, a portion of a keyboard matrix. In this case, the conductor layers 2 and 4 are constructed as a plurality of parallel row and column conductor strips respectively intersecting at island-shaped elements of the piezoelectric layer 3.

Figure 6:
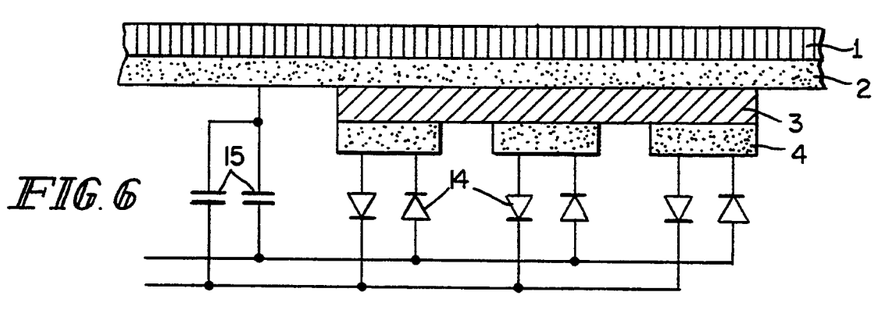
FIG. 6 is a lateral view of a part of a piezoelectric converter.

FIG. 6 shows an embodiment of the patterned element which is of converting converts mechanical into electric energy. In this case, the conducting layer 2 and the piezolayer 3 are applied as unpatterned surfaces. According to the application, the second conducting layer 4 may be patterned in a strip shape or in an island shape. When a structural element which is constructed in this manner is mechanically stressed by bending, for example, when it flutters in the wind as a "flag", positive or negative charges collect on the island or strips of the layer 4 which may be rectified by diodes 14 and charge capacitors 15. In this case, the diodes 14 as well as the capacitors 15 may be integrated in the structural element by means of thin-film or thick-film technology.

The electrostrictive effect which accompanies the piezoeffect permits the operating of a structural element according to the invention also in reverse. In this case, by feeding an electric voltage to the electrodes, a deformation of the piezoelectric layer can be caused. Thus, for example, very low-cost sound generators may be constructed.

Figure 9:
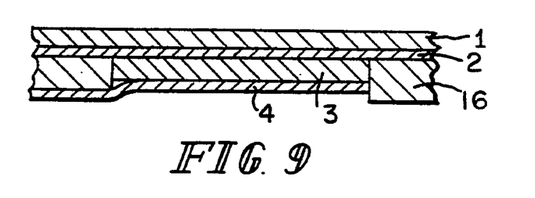
FIG. 9 is a cross-sectional view of another embodiment of an individual piezoelectric key according to the present invention.

According to a most preferred embodiment of the invention a keyboard or key is produced according to a method of FIG. 9 comprising the following steps:

(A) A base layer 1 is provided which serves as the substrate on which a monolithic piezoelectric "sandwich" is adheringly formed and which becomes part of the final keyboard or key.

An essential requirement for such a base layer is that it has at least one electrically conductive area 2 thereon. This requirement can be met in various ways: a first and frequently preferred embodiment is to use a self-supporting film of an organic polymer composition which consist essentially of an electrically insulated thermoplastic or "duroplastic" polymer, the latter being a polymer that is neither elastomeric nor thermoplastic but is crosslinked by any suitable method including, but not limited to "thermosetting".

Representative examples include films of commercially available polyesters, polycarbonates, polypropylene, polyamides, polyacetals etc. in thickness of typically in the range of from about 50 to 2000 µm. While flexibility of the base layer film is desirable, a capacity to be stretched upon tensile stress is not. Accordingly, molecular orientation of the film or an inherent crystallinity thereof are preferred. Suitable films are stable to aging and mechanically resistant; they may be translucent, transparent, or opaque and/or be colored. Thermal stability, such as evidenced by a softening temperature above 100° C., is highly desirable because it would not limit temperature application generally required for drying, setting, curing or whatever thermal treatments may be needed to produce the monolithic piezoelectric sandwich element.

The at least one electrically conductive area 2 can be applied to such organic polymer base layers either selectively (i.e. topically predetermined) or as a surface layer by conventional methods including by printing a pattern (e.g. screen printing), by sputtering, vacuum deposition or similar methods. The specific geometry of the electrically conductive areas 2 and 4 and the island of piezomaterial 3 therebetween may be any shape, for example, circular, polygonal, etc. The important thing is that they be a definite area which is responsive to the force 9 applied thereto without crosstalk.

Compositions suitable for topically selective application of electrically conductive layers are available commercially and generally include a binder and an electrically conductive material, e.g. a metallic pigment, such as silver, or carbon black. A specific example is "silver paint" as provided from various sources. The viscosity of such paints or inks is selected in line with the particular method of application, such as the sieve size (defined by conventional metric or non-metric standards), used to apply the at least one electrically conductive area (sometimes termed "first electrode layer herein" to distinguish from the second or any subsequent and electrically conductive layer of key or keyboard according to the invention).

The bond between the at least one electrically conductive area should be such that separation during normal use of the key or keyboard is substantially precluded. Bonding means, e.g. conventional priming layers on the basis of ionomers, EVA-resins, etc. or bonding surface treatments, e.g. by oxidation or halogenation of the surface of the polymeric base layer sheet may be needed or be advantageous to improve adhesion of the at least one electrically conductive area to the base layer.

Alternatively, the base layer may consist of an electrically conductive material, such as a metal sheet that may but need not have a surface pattern, e.g. formed by topical application of an electrically organic or inorganic material.

(B) Piezoelectric Precursor: It is an essential feature of the invention that the piezoelectric layer 3, or layers, of the novel key or keyboard is/are not prefabricated as in prior art keyboards, but formed on, and firmly adhere(s) to, the at least one electrically conductive area (which, in turn, firmly adheres to the base layer). As pointed out above, "firm adherence" as used herein is used synonymously with "not peelingly separable under operating conditions during the operative life of the key or keyboard". It has been found that this characteristic can be achieved according to the invention and is believed to be essential for commercial operability; in addition, any layer of a key or keyboard according to the invention must be coherent.

Figure 7:
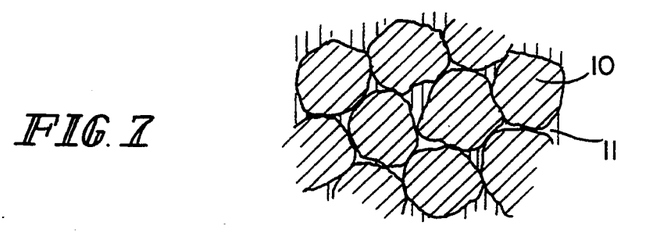
FIG. 7 is a sectional view of a piezoelectric composite material.

The term "precursor" as used herein with reference to the coherent layer (or layers) of piezoelectric material formed according to the invention refers to any system capable of existing in a non-solid, i.e. fluid state suitable for being applied as a thin film (the term "thin" referring to a thickness of typically in the range of from 1 to about 100 μm, preferably less that 20 μm when solidified). FIG. 7 illustrates a composite system which is suitable for an application by printing techniques. In this system a pulverized piezoelectric ceramic material 10 is suspended in a binding agent 11. The binding agent must have a hardness that is as high as possible so that forces can be transmitted to the grains as well as possible.

A preferred precursor is a "piezoelectric paint" which term generally refers to a liquid system of a finely divided solid material that is, or can be made, piezoelectric. Such solid materials typically are of the PZT-type (plumbum-zirconium-titanium) and generally are referred to as "ceramic" piezoelectric materials; they are commercially available from various sources. Typical particle sizes of piezoelectric solids for use herein are in the general range of from about 0.5 to about 20 μm, preferably in the range of from 1 to 10 μm and notably in the range of from about 1 to about 5 μm. The lower limit depends more upon availability of effective products rather than preference according to the invention. The upper limit, on the other hand is believed to be essential for most applications of the invention because of coherence and uniformity of the solid layers formed of such materials.

The concentration of piezoceramic powder is selected to be so high that a mechanical contact is ensured between as many adjacent ceramic fragments as possible which typically corresponds to a volume ratio between ink base or vehicle and ceramic material in the order of from 0.1 to 10. This is necessary in order to ensure a transmission of force to the grains that is as efficient as possible. In this case, the ceramic content is limited by the requirement with respect to adherence and the mechanical resistance of the dried material.

While other than "ceramic" solids, e.g. finely crystalline organic substances, such as normally solid organic acids or salts thereof, e.g. tartaric acid, tartrates, salicylates as well as saccharides, polyvinyl or polyvinylidene halides etc are not excluded herein, they are less preferred for most purposes.

The term "fluid" as used herein with reference to the precursor material includes liquid and gaseous states or systems. Liquid systems are generally preferred herein, mainly for practical reasons of simple handling, availability and relative ease of process control. Representative examples include dispersions of one or more finely divided solid piezoelectric materials in a liquid or pasteous mass, such as commercially available bases, "vehicles" or "lacquers" for screen printing techniques. Typically, such bases include one or more solvents as well as one or more binders, e.g. organic polymers dissolved in suitable solvents and, optionally, additives and adjuvants, e.g. to control the rate of evaporation, setting, curing, etc.

Examples of other liquid or gaseous systems include substances that are capable of being applied by sputtering or vapor deposition techniques, i.e. any substances that can form a piezoelectric solid from a gaseous or liquid precursor, such as zinc oxide, etc.

(C) Application of precursor: The technique used for application of the precursor depends, of course, on the type of precursor system used. With the preferred liquid system, films of the precursor can be deposited by screen printing, spraying, roller coating, etc. Such liquid systems can, and preferably are, applied by depositing a sequence of thin films as defined above, preferably with intermediate solidification, such as by drying, setting or curing. The spacer 16 having openings 15 for the precursor may be also formed by printing or may be a layer formed and patterned to have opening 14. The spacer may be applied prior to the precursor and used in the application process or may be applied after the application of the precursor. The spacer preferably is incompressible to prevent crosstalk.

(D) Transforming the precursor layer: Again, the technique used for transforming the precursor depends upon the system used. With the preferred liquid systems, transformation is effected by solidification, e.g. removal of a liquid phase such as by drying, setting or curing. For many purposes, thermal transformation methods are preferred as long as no damage to other constituents is incurred. Temperatures in the range of from about 50° to 200° C. are typical. For many purposes, it is preferred that the resulting coherent layer has a thickness of below about 125 μm and notably below 100 μm. A particularly preferred thickness is even lower, i.e. below 75 μm and notably below about 50 μm. However, the layer must be coherent in the sense defined above and this may require repeated application and repeated solidification, depending upon the constituents used, notably the elasticity of a polymer matrix containing the finely dispersed solid piezoelectric material.

As mentioned, the resulting layer should be essentially "uniform". Generally, this term refers to the fact that the coherent piezoelectric layer must preclude shorting of the adjacent electrode layers. A common source of insufficient uniformity of layers produced by solidification of a liquid or pasteous system is inclusion of small, if not microscopic air bubbles. A conventional means to avoid this is degassification, e.g. by reduced pressure. Another method for obtaining or improving coherence and uniformity of the piezoelectric layer is application of a mechanical or hydrostatic pressure.

Optimum results can be achieved for a given system by a few and simple experiments, such as by measuring the electric performance of the layers, preferably after both adjacent electrode layers 2 and 4 have been formed.

The term "composite" as used herein with reference to the coherent piezoelectric film according to the invention is intended to include any layer system that is formed by a multiplicity of solid particles, regardless of the type of bonding. This includes surface bonding of the type found in a layer formed by electrodeposition as well as by use of connecting or adhesive substances. Preferred means of bonding of the piezoelectric particles include forming a "matrix", e.g. of an inorganic or, preferably, organic substance, such as a polymer which may, but need not be, cross linked. Preferably, the matrix forms an essentially continuous phase firmly holding the solid particles of the piezoelectric material and precluding undesirable changes of the layer upon prolonged mechanical stress (e.g. switching the key two or four million times) and ageing (as evidenced by accelerated test, such as operation at elevated temperatures, assumed to be equivalent to several years of operation).

It is to be noted in this context that it is surprising to find that keys or keyboards which satisfy such stringent requirements can be obtained according to the invention thus, two main objects of the invention can be achieved, namely a substantially improved economy of production as well as equal or improved performance.

Figure 10:
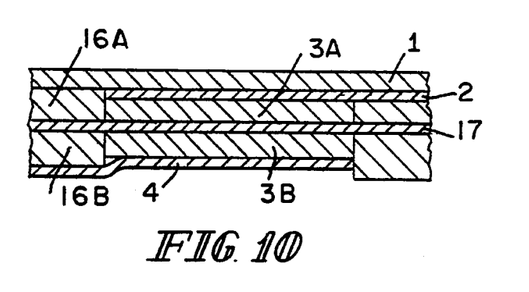
FIG. 10 is a cross-sectional view of a bimorphic individual piezoelectric key according to the present invention.

(E) Optional second Electrode Layer: Upon completion of Step (D) another electrically conductive layer 4 (second electrode layer) is formed on top of the film of composite piezoelectric material 3 as shown in FIG. 10. Generally, this can be achieved in the manner explained above in step (A) for forming the first electrode layer 2 on an electrically insulating substrate and does not need further explanation. A protective or insulative layer, such as layer 5 can be applied over the second electrode layer 4.

(F) Polarization or poling: As is known in the art, exposure to an electric potential or field is generally required if a pressure-sensitive element including a piezoelectric material is to be activated. Typical conventional poling methods can be applied herein by applying a voltage across conductive layers 2 and 4. The electric field in the interior of the ferroelectric must be so large that it exceeds the coercive field. This is particularly significant when the relative permittivity of the ferroelectric is much higher than that of the binding material, which results in a corresponding reduction of a fed electric field in the interior of the ferroelectric.

By lowering or raising the temperature during the polarization operation, it is also possible to reduce the relative permittivity and the coercive field of the ferroelectric and thus facilitate polarization. Preferably, poling is effected at elevated temperatures (e.g. 80°–150° C.) when the piezoelectric layer is a composite with a polymer matrix. Pressure may, but need not, be applied simultaneously.

Further, poling can be effected before or after application of a cover layer and any additional support layers, such as substantially rigid mounting plates 8.

Figure 8:
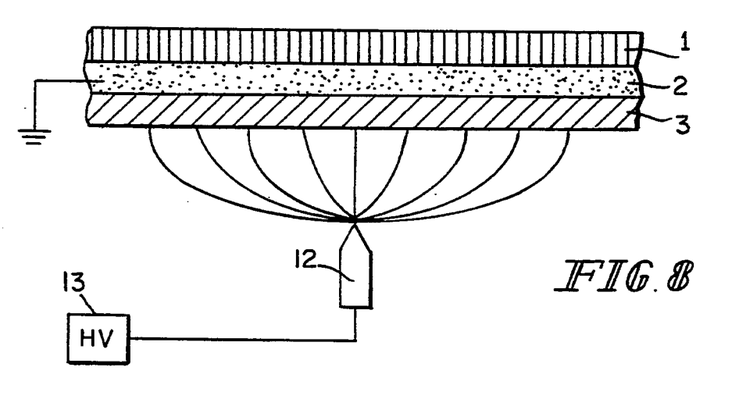
FIG. 8 is a view of an arrangement for the corona polarizing of the piezoelectric composite material.

In order to avoid breakdowns between the electrodes during the polarization process, the polarization may be carried out by corona polarization. This takes place after the solidification of the piezomaterial 3 but before the application of the second electrode layer 4. In this case, as illustrated in FIG. 8, the first conducting layer 2 is connected to the earth or ground potential. Then, an electrode needle 12, which is situated a few centimeters away from the substrate, is connected with a high-voltage source 13. The resulting corona discharge leads to surface charges on the piezomaterial which is polarized as a result.

The different methods of polarization, particularly the electrode polarization, permit the polarization of the piezomaterial only locally at desired points, whereby the inductive disturbances between adjacent areas can be reduced.

Another implementation of the piezomaterial consists of a suitable piezoelectric polymer, such as polarized polyvinylidenefluoride (PVDF). In this case, the polymer is printed either in a dissolved form or above the melting point of from 160° to 180° C. The material may also be applied, for example, by an electrostatic powder spray method. After the application, it is polarized by an electric field, in which case the above-described methods may be used. This must take place above the glass temperature or when the film is not yet dry.

It is also possible to use a polarized foil of this type as a carrier foil onto which all other layers are applied, for example, by printing techniques.

As shown in FIG. 9, the combined thickness of the piezomaterial 3 and electrically conductive layer 4 is less than the thickness of spacer 16. This will produce the gap below the sandwich allowing it to flex as does the bonding layer 6 in FIG. 1. Conventional distancing or spacing means may include, e.g. a piece of cardboard or plastic having openings matching with the pattern of the keyboard. In this context, reference is made to EP-A-0 472 888 corresponding to U.S. Ser. No. 07/751,987 the disclosure of which is incorporated herein by way of reference. The art also shows various means of sealing a cover sheet which may, but need not be, of the same type as the base layer in its preferred form as a film of organic polymer material.

Generally, the distancing means serves to provide a tiny hollow space below each key such that the piezoelectric layer is supported around its periphery but is not or less supported at its center so that a pressure acting upon the top of the keyboard will cause a bending stress for increasing the electric signal. Since this feature is known in the art, further explanation is not required here.

As also is known per se in the piezoelectric art, keys or keyboards can have a so-called bimorphic structure. This can be achieved in an improved manner according to the invention by a repetition of steps (C) to (E). As shown in FIG. 10, the monolithic piezoelectric sandwich according to this embodiment will include two coherent films 3A and 3B of solid piezoelectric material between the first and second electrode layers 2, 3 and separated by an intermediate or "third" electrode layer 17. Also, additional or intermediate layers may be provided for improved adhesion, coherence or compatibility of adjacent layers.

Figure 11:
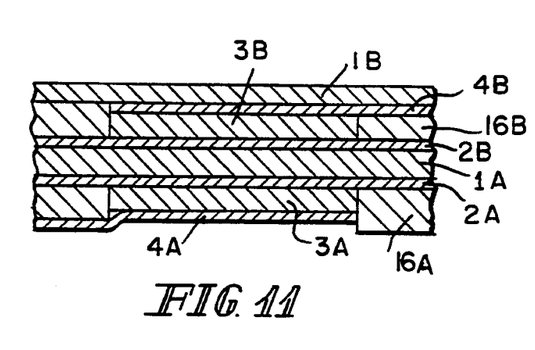
FIG. 11 is a cross-sectional view of a modification of the piezoelectric key of FIG. 10.

Another multi-layered piezomaterial embodiment is illustrated in FIG. 11 for increasing the thickness of the sandwich without compromising the integrity of coherency of the piezomaterial. A base 1A has first electrode layers 2A and 2B on each side thereof. Piezoelectric material islands 3A and 3B are formed on a respective first electrode layer 2A and 2B and a second electrode layer 4A and 4B are formed on the islands 3A and 3B.

In all preferred embodiments of the invention, the key or keyboard should incorporate a stable "monolithic" structure of the piezoelectric sandwich element, i.e. a multi-layered structure comprising the base layer, an electrode layer and the piezoelectric film layer in the form of an integral structure in which the layers are in a mutually adhering relation of the type produced by applying layers from corresponding precursors, i.e. compositions or substances containing or providing the required constituents in a system that is fluid rather than solid and, consequently, is not used or applied as a prefabricated element.

The following example is given to illustrate without limitation preferred embodiments of the invention. Parts and percentages are by weight unless otherwise indicated.

EXAMPLE I

A pressure sensitive keyboard was produced as follows:

(a) Base Layer

The base layer used for producing the keyboard was a commercial polyethylene terephthalate film (thickness 175 $\mu$m; trade mark Melinex, type 505 ST supplied by ICI) having a conventional primer layer or being chlorinated in a conventional manner on its surface for improved adhesion.

(b) First Conductive Layer

A commercial silver paint (e.g. as obtainable from Acheson Industries USA or Olin Hunt, UK) was applied topically on the base layer by screen printing (screen standard 90 T corresponding with 230 T mesh) at a thickness (dry) of about 7.5 $\mu$m to produce a keyboard pattern of a type know per se consisting of sixteen key areas and a first pattern of conductor paths for individual or group (row/column) connections. The pattern was obtained in conventional photographic manner to form sixteen circular electrode areas and connecting conductor paths. The printed pattern was air-dried during 20 minutes at 110° C.

(c) Piezoelectric Layer

A printing ink was prepared by milling on a laboratory mill;

100 parts of commercial PZT-type ceramic powder (supplied by Philips, Netherlands, type PXE 5 or type PXE 52) having particle sizes in the range of from 0.5 to 2.5 micrometer;

20 parts of commercial screen printing lacquer (supplied form Printcolor, Switzerland, as resin 290-05;

5 parts of acryl lacquer (Printcolor, type 290);

1 part of evaporation-retarding agent (Printcolor, type 10-99);

Milling was repeated 3 times to achieve homogeneity (by visual appearance) and a viscosity in the conventional screen printing range.

The ink was applied topically onto the base layer in the area of the electrode portions produced in paragraph (b) by printing three times with a screen of 43 T (110 mesh T) taking care to avoid formation of air bubbles in the layer. A photographically produced pattern was used to concentrically cover the electrode areas produced in paragraph (b) and overlapping them by a margin of about 1 mm. After each printing operation, the applied layer was air-dried 30 min at 100° C. Total thickness of the resulting dried piezoelectric film was about 50 $\mu$m.

(d) Second Electrode Layer

A pattern of electrodes substantially as in section (b) and with a corresponding set of connecting paths for individual activation of each key was applied onto the base layer in the areas matching with the pattern produced in paragraphs (b) and (c) by screen printing with a 120 T (305 T mesh) screen in the manner explained in paragraph (b). The printed layer was air-dried 20 min at 110° C.

(e) Protective Layer

A sealing layer was applied over the area of the connector ends by applying a layer of UV-polymerizable lacquer (supplied by Olin Hunt, type Iso UV) through a 120 T screen (305 mesh) Irradiation with actinic UV radiation was effected using a commercial UV-lamp.

(f) Poling (polarization)

The product of paragraph (e) was heated to about 150° C. between two plates pressed against each other (0.0 bar) and a potential of 100 V DC was applied between each pair of electrodes via the conductor paths. Poling was continued for 10 minutes.

(g) Covering Layer and Distancing Insert

A sheet of polyethylene terephthalate of 125 $\mu$m thickness was connected adhesively with a paper sheet having openings corresponding essentially with the electrode pattern so as to provide disk-shaped hollow spaces below each sandwich of two electrodes and the intermediate piezoelectric layer upon mutual sealing. This sheet was aligned with the polarized product and adhesively sealed therewith using commercial adhesive such as adhesive type 467 supplied by 3M (Minnesota, Mining and Manufacturing Co). The final product produced a maximum signal strength of about 10 V.

EXAMPLE II

A pressure sensitive keyboard was produced as follows:

(a) Base Layer

The base layer 1A used for producing the keyboard was a commercial polyethylene terephthalate film (thickness 175 $\mu$m; trade mark Melinex 505st supplied by ICI), having a conventional primer layer or being chlorinated in a conventional manner on both surfaces for improved adhesion.

(b) Base Conductive Layers

The same silver paint was applied topically on both sides of the base layer 1A in the same way as the first conductive layer of Example I. A pattern 2A, 2B of sixteen key areas and connection conductor path was obtained on both sides of the base layer.

(c) Piezoelectric Layers

A piezoelectric printing ink was prepared in the same way as in Example I. The ink was applied by screen printing onto both sides of the base layer on the area of the sixteen conducting key areas produced in paragraph (b). The printing was repeated three times in the same way as in Example I, also overlapping the key areas produced in paragraph (b). Total thickness of each of the resulting films 3A, 3B was again about 50 $\mu$m.

(d) Top Conductive Layer

A pattern of electrodes was applied onto the same piezoelectric layers on both sides of the base layer in the same was as the second electrode layer 4A, 4B of Example I.

(e) Protective Layers

A sealing layer to protect and electrically insulate the sandwich structure produced in paragraphs (a) to (d) was applied on both sides of the base layer in the same way as the protective layer of Example I.

(f) Poling

For poling the resulting bimorphic structure produced in paragraphs (a) to (e), the base conductive layers 2A and 2B of all the thirty-two sandwich elements were connected together in series. The exterior conductive layers of 4A of the sixteen sandwich elements on one side of the base layer were connected together and the sixteen conductive areas of layer 4B on the other side were connected together. A voltage of 200 V DC was applied across the two exterior conductive layers 4A, 4B and the product was heated to 150° C. The poling was continued for 10 minutes. While poling, the sandwich elements of the both sides of the base layer were connected in series. After poling, the two corresponding sandwich elements were connected in parallel by connecting the base and exterior conductive layers of the same.

(g) Covering Layer and Distancing Insert

A sheet of polyethylene terephthalate of 125 μm thickness was connected adhesively with a paper sheet having openings corresponding essentially with the electrode pattern so as to provide disk-shaped hollow spaces below each sandwich of two electrodes and the intermediate piezoelectric layer upon mutual sealing. This sheet was aligned with the polarized product and adhesively sealed therewith using commercial adhesive such as adhesive type 467 supplied by 3M (Minnesota, Mining and Manufacturing Co). The final product produced a maximum signal strength of about 10 V.

EXAMPLE III

This example illustrates a preferred embodiment of producing the distancing means for a key or keyboard according to the invention by fluid-deposition technique rather than by using a prefabricated insert.

Examples I was repeated except that the distancing means, i.e. spacer layer 16 (FIG. 9), was applied by printing prior to step (d) to form a layer of a total thickness of about 100 μm. Printing can be effected as in Example I, paragraph (c), except that addition of the ceramic material to the ink base is replaced by an "inert" constituent as explained below. Alternatively, spacing layers may be produced according to the invention by printing a pattern using an ink made of a UV-curable polymer as above or a reactive polymer composition, such as commercial epoxide polymers with suitable curing agents, e.g. Araldit ® provided that such polymer is "inert" as well.

This is explained as follows: any ingredient of a distancing means or spacer layer produced by a fluid-application technique according to the invention should preferably be "piezoelectrically inert"; this term is based upon the conventional piezoelectric strain constant indicated typically in picoCoulomb per Newton (pC/N), generally also identifying the directions of piezoelectric charge or impulse versus mechanical strain by subscripts "$d_{xy}$", e.g. $d_{31}$. Thus, any material used as a constituent of the distancing layer should have a piezoelectric strain constant not exceeding about 1 percent (numeric basis) of the piezoelectric strain constant of the associated piezoelectric layer, e.g. $d_{31}$(layer 16)$\leq$0.01 $d_{31}$(layer 3).

An ink suitable for use in producing a distancing layer can be applied in a single application step if it has sufficient consistency or body, e.g. as obtained by use of a solvent-free liquid polymer composition or by using a filler, such as typically a glass powder or any particulate solid substance that is "inert" in the above sense as well as in the normal chemical sense; many inorganic silicates, carbonates and oxide meet this requirement and are of use. Preferred particle sizes are below 50 μm, e.g. up to 30 μm.

EXAMPLE IV

Example II is repeated except that the distancing means 16A, 16B (FIG. 10) are produced by printing using an ink composed of glass powder (particle size below about 20 μm) and a commercial ink base, such as the base used in example I, paragraph (c) in a proportion of about 2:3, i. containing about 35% of glass powder.

The distancing layer 16A is applied after forming the first piezoelectric layer 3A by printing and prior to forming the third electrode layer 17; distancing layer 16B is applied with the same ink as layer 16A but after forming of the second piezoelectric print layer 3B and prior to forming the electrode layer 4.

EXAMPLE V

The procedure essentially as described in Example III was repeated for producing a key or keyboard structure of the type shown in FIG. 11. Starting from base layer 1A, a first "sandwich" structure is formed thereon by applying, in sequence, conducting electrode layer 2A, piezoelectric layer 3A, spacing layer 16A and electrode layer 4A. Then, a second sandwich structure was formed on the reverse side of base layer 1A by applying, in sequence, conducting electrode layer 2B, piezoelectric layer 3B, spacing layer 16B and electrode layer 4B. Thereupon, a covering layer 1B was applied as in example I. Of course, the sequence of producing the two sandwich structures could be inverted starting with application of electrode layer 2B on the reverse side of base layer 1A.

EXAMPLE VI

Figure 12:
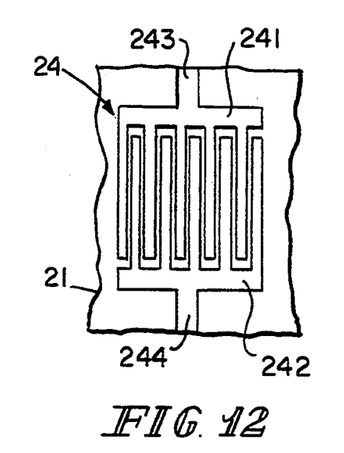
FIG. 12 is a schematic and broken-away top view of the electrodes of a key or keyboard according to the invention in a co-planar or "digital" arrangement on a base layer.
Figure 13:
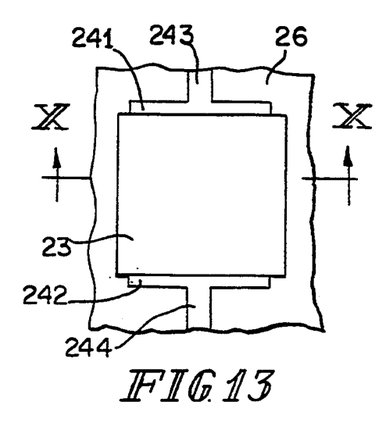
FIG. 13 is the top view of FIG. 12 after application of the piezoelectric layer onto the electrode pair by fluid deposition technique according to the invention.
Figure 14:
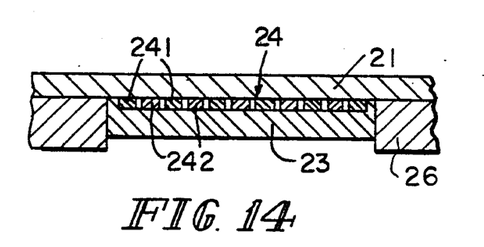
FIG. 14 is a sectional view of the structure shown in FIG. 13.

A key or keyboard with a structure as illustrated in FIGS. 12–14 was produced according to the invention as follows: a base layer 21 was provided, by means of sieve printing as in example I, or by vacuum deposition (or any other technique suitable for producing relatively thin, electrically conductive layers on a polymer substrate), with an electrically conductive pattern in the manner of conventional interdigital transducers and consisting of two mutually distanced coplanar electrodes 241, 242 each having a connecting path 243, 244.

Then, the piezoelectric layer 23 is applied in the same manner as in paragraph (c) of example I. For the sake of better understanding, layer 23 is shown as overlapping on the sides but without completely covering electrodes 241, 242. This is not critical, however, and it is preferred for many purposes that layer 23 essentially covers or even overlaps electrodes 241, 242. Then, spacing layer 26 is produced in the manner explained above, and any further processing towards the desired final product may follow.

Poling can be effected by means of an electrical field applied between each pair of digits of electrodes 241, 242 via the conductive paths 243, 244. A part of the field penetrates into piezoelectric layer 23 and causes poling in the area around the digits.

When a mechanical strain is made to act upon the sensitive area of a key or keyboard so produced, i.e. in the area of the interspace between the co-planar electrode layers with the co-acting piezoelectric layer 23, an electrical signal of typically about 5 V is generated between electrodes 241, 242. Signal processing can be effected as shown in FIG. 6.

Various modifications within the scope of the invention will be apparent to those experienced in the production of piezoelectric keys or keyboards—the latter being a repetition of the former plus the required circuitry in a given pattern of ten, twenty six, forty eight or more individual keys representing any symbol, such as alphanumeric characters or other symbols used for a system that can be controlled from a keyboard.

For example, various other piezoelectric materials could be used, and could be applied in the form of compositions that involve a fluid (i.e. liquid or gaseous) precursor system containing materials suitable for forming a coherent piezoelectric layer. For example, the polymer of the matrix of the composite piezoelectric layers explained above, could be piezoelectrically active rather than inert. Also, application methods other then screen printing, e.g. spraying, brushing, dip-coating etc. can be used provided that the required topically defined patterns needed for piezoelectric keys or keyboards can be obtained in commercial manufacture such that an essentially automated assembly of all constitutent is achieved in production of piezoelectric keys or keyboards.

We claim:

1. A method of manufacturing a pressure-sensitive electronic key or keyboard comprising the steps of:
   providing a base layer having at least one first electrically conductive area;
   applying at least one thin layer of a fluid comprising an organic polymer and a particulate piezoelectric material as a precursor material onto said at least one first electrically conductive area;
   transforming said at least one thin layer of said precursor material into an essentially coherent and uniform solid film of a composite of said piezoelectric material embedded in a matrix of said organic polymer firmly adhering to said first electrically conductive area;
   forming a second electrically conductive area spaced from said first electrically conductive area by and firmly adhering to said solid film of composite of said piezoelectric material embedded in said matrix and bridging a space between said electrically conductive areas for providing at least one essentially monolithic piezoelectric element which firmly adheres to said base layer and comprises said solid film of said composite of said piezoelectric material embedded in said matrix with said first and second electrically conductive areas; and
   polarizing said piezoelectric material embedded in said matrix with respect to said first and second electrically conductive areas.

2. A method of manufacturing a pressure-sensitive electronic key or keyboard comprising the steps of:
   providing a base layer of an organic polymer composition having an electrically conductive layer applied by a fluid-deposition technique and adhering to at least one area on one side of said organic polymer film to form at least one first electrically conductive area;
   applying at least one thin layer of a fluid piezoelectric precursor material onto said at least one first electrically conductive area by a fluid-deposition technique;
   transforming said at least one thin layer of said precursor material into an essentially coherent and uniform solid film of a composite piezoelectric material firmly adhering to said first electrically conductive area;
   forming a second electrically conductive area spaced from said first electrically conductive area by and firmly adhering to said solid composite piezoelectric material which bridges the space between said electrically conductive areas for providing at least one essentially monolithic piezoelectric element which firmly adheres to said base layer and comprises said solid composite piezoelectric material with said first and second electrically conductive areas; and
   polarizing said composite piezoelectric material with respect to said first and second electrically conductive areas.

3. The method of claim 2 wherein said fluid deposition technique is a screen printing technique.

4. A method of manufacturing a pressure-sensitive electronic key or keyboard comprising the steps of:
   a) providing a base layer having at least one first electrically conductive area;
   b) applying at least one thin layer of a fluid piezoelectric precursor material onto said at least one first electrically conductive area;
   c) transforming said at least one thin layer of said precursor material into an essentially coherent and uniform solid film of a composite piezoelectric material firmly adhering to said first electrically conductive area;
   d) forming a second electrically conductive area spaced from said first electrically conductive area by and firmly adhering to said solid composite piezoelectric material which bridges the space between said electrically conductive areas for providing at least one essentially monolithic piezoelectric element which firmly adheres to said base layer and comprises said solid composite piezoelectric material with said first and second electrically conductive areas;
   e) repeating steps b) through d) to form a bimorphic piezoelectric sandwich element comprising two superimposed coherent solid films of said composite piezoelectric material separated by a third electrically conductive area adheringly connected to both of said superimposed films of said composite piezoelectric material; and
   f) polarizing said composite piezoelectric material with respect to said first, second and third electrically conductive areas.

5. The method of claim 4 wherein said base layer is provided with at least one first electrically conductive area on each side thereof; and wherein steps b) through d) are performed on the first electrically conductive area on each side of said base layer.

6. A method of manufacturing a pressure-sensitive electronic key or keyboard comprising the steps of:
   providing a base layer having at least one first electrically conductive area;
   applying at least one thin layer of a fluid piezoelectric precursor material onto said at least one first electrically conductive area;
   transforming said at least one thin layer of said precursor material into an essentially coherent and uniform solid film of a composite piezoelectric material firmly adhering to said first electrically conductive area;
   forming at least one spacer in an area adjacent said solid composite piezoelectric material;
   forming a second electrically conductive area spaced from said first electrically conductive area by and firmly adhering to said solid composite piezoelectric material which bridges the space between said electrically conductive areas for providing at least one essentially monolithic piezoelectric element which firmly adheres to said base layer and comprises said solid composite piezoelectric material with said first and second electrically conductive areas; and polarizing said composite piezoelectric material with respect to said first and second electrically conductive areas.

7. The method of claim 6 wherein said spacer is formed by printing.

8. The method of claim 7 wherein said spacer is formed by printing a layer essentially composed of piezoelectrically inert materials.

9. The method of claim 6 wherein said spacer is formed prior to applying said precursor material.

10. The method of claim 6 wherein said spacer is formed after applying said precursor material.

* * * * *